(12) United States Patent  (10) Patent No.: US 7,808,022 B1
Dierickx  (45) Date of Patent: Oct. 5, 2010

(54) CROSS TALK REDUCTION

(75) Inventor: Bart Dierickx, Edegem (BE)

(73) Assignee: Cypress Semiconductor Corporation, San Jose, CA (US)

( * ) Notice: Subject to any disclaimer, the term of this patent is extended or adjusted under 35 U.S.C. 154(b) by 252 days.

(21) Appl. No.: 11/392,410

(22) Filed: Mar. 28, 2006

Related U.S. Application Data

(60) Provisional application No. 60/666,080, filed on Mar. 28, 2005.

(51) Int. Cl.
*H01L 27/146* (2006.01)
*H01L 31/06* (2006.01)

(52) U.S. Cl. .................. 257/292; 257/291; 257/293; 257/294; 257/461; 257/462; 257/446; 257/E27.131; 257/E27.132; 257/E27.133; 438/48; 438/54; 438/69; 438/458

(58) Field of Classification Search ............ 257/291, 257/292, 293, 294, 461, 462; 438/48, 54
See application file for complete search history.

(56) References Cited

U.S. PATENT DOCUMENTS

| | | | |
|---|---|---|---|
| 3,770,968 A | 11/1973 | Hession et al. | |
| 3,904,818 A | 9/1975 | Kovac | |
| 4,148,048 A | 4/1979 | Takemoto et al. | |
| 4,253,120 A | 2/1981 | Levine | |
| 4,274,113 A | 6/1981 | Ohba et al. | |
| 4,373,167 A | 2/1983 | Yamada | |
| 4,389,661 A | 6/1983 | Yamada | |
| 4,473,836 A | 9/1984 | Chamberlain | |
| 4,484,210 A | 11/1984 | Shiraki et al. | |
| 4,498,013 A | 2/1985 | Kuroda et al. | |
| 4,565,756 A | 1/1986 | Needs et al. | |
| 4,580,103 A | 4/1986 | Tompsett | |
| 4,581,103 A | 4/1986 | Levine et al. | |
| 4,628,274 A | 12/1986 | Vittoz et al. | |
| 4,630,091 A | 12/1986 | Kuroda et al. | |
| 4,647,975 A | 3/1987 | Alston et al. | |
| 4,696,021 A | 9/1987 | Kawahara | |
| 4,703,169 A | 10/1987 | Arita | |
| 4,774,557 A | 9/1988 | Kosonocky | |
| 4,809,074 A | 2/1989 | Imaide et al. | |
| 4,814,848 A | 3/1989 | Akimoto et al. | |
| 4,831,426 A | 5/1989 | Kimata et al. | |

(Continued)

FOREIGN PATENT DOCUMENTS

CA  2132629 A1  9/1993

(Continued)

OTHER PUBLICATIONS

Bart Dierickx, Jan Bogaerts, "NIR-enhanced image sensor using multiple epitaxial layers" presented Electronic Imaging Jan. 21, 2004, San Jose, California, SPIE proceedings vol.

(Continued)

*Primary Examiner*—Dao H Nguyen

(57) ABSTRACT

A method and apparatus for reducing cross-talk between pixels in a semiconductor based image sensor. The apparatus includes neighboring pixels separated by a homojunction barrier to reduce cross-talk, or the diffusion of electrons from one pixel to another. The homojunction barrier being deep enough in relation to the other pixel structures to ensure that cross-pixel electron diffusion is minimized.

15 Claims, 10 Drawing Sheets

U.S. PATENT DOCUMENTS

| | | | |
|---|---|---|---|
| 4,914,493 A | 4/1990 | Shiromizu |
| 4,951,105 A | 8/1990 | Yamada |
| 4,984,044 A | 1/1991 | Yamamura |
| 4,984,047 A | 1/1991 | Stevens |
| 4,998,265 A | 3/1991 | Kimata |
| 5,084,747 A | 1/1992 | Miyawaki |
| 5,101,253 A | 3/1992 | Mizutani et al. |
| 5,122,881 A | 6/1992 | Nishizawa et al. |
| 5,128,534 A | 7/1992 | Wyles et al. |
| 5,144,447 A | 9/1992 | Akimoto et al. |
| 5,146,074 A | 9/1992 | Kawahara et al. |
| 5,153,420 A | 10/1992 | Hack et al. |
| 5,162,912 A | 11/1992 | Ueno et al. |
| 5,164,832 A | 11/1992 | Halvis et al. |
| 5,182,446 A | 1/1993 | Tew |
| 5,182,623 A | 1/1993 | Hynecek |
| 5,191,398 A | 3/1993 | Mutoh |
| 5,258,845 A | 11/1993 | Kyuma et al. |
| 5,270,531 A | 12/1993 | Yonemoto |
| 5,283,428 A | 2/1994 | Morishita et al. |
| 5,296,696 A | 3/1994 | Uno |
| 5,306,905 A | 4/1994 | Guillory et al. |
| 5,307,169 A | 4/1994 | Nagasaki et al. |
| 5,311,319 A | 5/1994 | Monoi |
| 5,321,528 A | 6/1994 | Nakamura |
| 5,329,112 A | 7/1994 | Mihara |
| 5,335,008 A | 8/1994 | Hamasaki |
| 5,345,266 A | 9/1994 | Denyer |
| 5,434,619 A | 7/1995 | Yonemoto |
| 5,436,949 A | 7/1995 | Hasegawa et al. |
| 5,461,425 A | 10/1995 | Fowler et al. |
| 5,496,719 A | 3/1996 | Miwada et al. |
| 5,519,207 A | 5/1996 | Morimoto |
| 5,528,643 A | 6/1996 | Hynecek |
| 5,576,763 A | 11/1996 | Ackland et al. |
| 5,578,842 A | 11/1996 | Shinji |
| 5,587,596 A | 12/1996 | Chi et al. |
| 5,608,204 A | 3/1997 | Hofflinger et al. |
| 5,608,243 A | 3/1997 | Chi et al. |
| 5,614,744 A | 3/1997 | Merrill |
| 5,625,210 A | 4/1997 | Lee et al. |
| 5,625,322 A | 4/1997 | Gourgue et al. |
| 5,656,972 A | 8/1997 | Norimatsu |
| 5,668,390 A | 9/1997 | Morimoto |
| 5,675,158 A | 10/1997 | Lee |
| 5,710,446 A | 1/1998 | Chi et al. |
| 5,714,753 A | 2/1998 | Park |
| 5,721,425 A | 2/1998 | Merrill |
| 5,737,016 A | 4/1998 | Ohzu et al. |
| 5,754,228 A | 5/1998 | Dyck |
| 5,786,607 A | 7/1998 | Ishikawa et al. |
| 5,793,423 A | 8/1998 | Hamasaki |
| 5,808,677 A | 9/1998 | Yonemoto |
| 5,812,191 A | 9/1998 | Orava et al. |
| 5,828,091 A | 10/1998 | Kawai |
| 5,841,126 A | 11/1998 | Fossum |
| 5,841,159 A | 11/1998 | Lee et al. |
| 5,861,621 A | 1/1999 | Takebe et al. |
| 5,872,371 A | 2/1999 | Guidash et al. |
| 5,872,596 A | 2/1999 | Yanai |
| 5,886,353 A | 3/1999 | Spivey et al. |
| 5,898,168 A | 4/1999 | Gowda et al. |
| 5,898,196 A | 4/1999 | Hook et al. |
| 5,903,021 A | 5/1999 | Lee et al. |
| 5,904,493 A | 5/1999 | Lee et al. |
| 5,933,190 A | 8/1999 | Dierickx |
| 5,952,686 A | 9/1999 | Chou et al. |
| 5,953,060 A | 9/1999 | Dierickx |
| 5,955,753 A | 9/1999 | Takahashi |
| 5,956,570 A | 9/1999 | Takizawa |
| 5,973,375 A | 10/1999 | Baukus et al. |
| 5,977,576 A | 11/1999 | Hamasaki |
| 5,990,948 A | 11/1999 | Sugiki |
| 6,011,251 A | 1/2000 | Dierickx et al. |
| 6,040,592 A | 3/2000 | McDaniel et al. |
| 6,043,478 A | 3/2000 | Wang |
| 6,051,857 A | 4/2000 | Miida |
| 6,100,551 A | 8/2000 | Lee et al. |
| 6,100,556 A | 8/2000 | Drowley et al. |
| 6,107,655 A | 8/2000 | Guidash |
| 6,111,271 A | 8/2000 | Snyman et al. |
| 6,115,066 A | 9/2000 | Gowda et al. |
| 6,133,563 A | 10/2000 | Clark et al. |
| 6,133,954 A | 10/2000 | Jie et al. |
| 6,136,629 A | 10/2000 | Sin |
| 6,137,100 A | 10/2000 | Fossum et al. |
| 6,166,367 A | 12/2000 | Cho |
| 6,188,093 B1 | 2/2001 | Isogai et al. |
| 6,194,702 B1 | 2/2001 | Hook et al. |
| 6,204,524 B1 | 3/2001 | Rhodes |
| 6,225,670 B1 | 5/2001 | Dierickx |
| 6,239,456 B1 | 5/2001 | Berezin et al. |
| 6,316,760 B1 | 11/2001 | Koyama |
| 6,403,998 B1 * | 6/2002 | Inoue ................ 257/292 |
| 6,459,077 B1 | 10/2002 | Hynecek |
| 6,545,303 B1 | 4/2003 | Scheffer |
| 6,570,618 B1 | 5/2003 | Hashi |
| 6,631,217 B1 | 10/2003 | Funatsu et al. |
| 6,636,261 B1 | 10/2003 | Pritchard et al. |
| 6,778,214 B1 | 8/2004 | Toma |
| 6,815,791 B1 | 11/2004 | Dierickx |
| 6,825,455 B1 | 11/2004 | Schwarte |
| 6,836,291 B1 | 12/2004 | Nakamura et al. |
| 6,906,302 B2 | 6/2005 | Drowley |
| 6,967,316 B2 * | 11/2005 | Lee ................ 250/208.1 |
| 6,975,356 B1 | 12/2005 | Miyamoto |
| 7,199,410 B2 | 4/2007 | Dierickx |
| 7,253,019 B2 | 8/2007 | Dierickx |
| 7,256,469 B2 * | 8/2007 | Kanbe ................ 257/461 |
| 2002/0022309 A1 | 2/2002 | Dierickx |
| 2003/0011694 A1 | 1/2003 | Dierickx |
| 2007/0145503 A1 | 6/2007 | Dierickx |

FOREIGN PATENT DOCUMENTS

| | | |
|---|---|---|
| EP | 0260954 A1 | 3/1988 |
| EP | 0548987 A1 | 6/1993 |
| EP | 0635973 A1 | 1/1995 |
| EP | 0657863 A1 | 6/1995 |
| EP | 0739039 A1 | 10/1996 |
| EP | 0773669 A1 | 5/1997 |
| EP | 0632930 A1 | 7/1998 |
| EP | 0858111 A1 | 8/1998 |
| EP | 0858212 A1 | 8/1998 |
| EP | 0883187 A1 | 12/1998 |
| EP | 0903935 A1 | 3/1999 |
| EP | 0978878 A1 | 2/2000 |
| GB | 2324651 A1 | 10/1998 |
| JP | 01-204579 A1 | 8/1989 |
| JP | 02-050584 A1 | 2/1990 |
| JP | 04088672 A1 | 2/1992 |
| JP | 04-207589 A1 | 7/1992 |
| JP | 05-030433 A1 | 2/1993 |
| JP | 06-284347 A1 | 10/1994 |
| JP | 07-072252 A1 | 3/1995 |
| JP | 09321266 A1 | 12/1997 |
| WO | 9304556 A1 | 3/1993 |
| WO | 9319489 A1 | 3/1993 |
| WO | 9810255 A1 | 3/1998 |
| WO | 9916268 A1 | 4/1999 |

WO 0055919 A1 9/2000

OTHER PUBLICATIONS

European Search Report for Application No. 01204595.1-2203 dated Nov. 28, 2005; 8 pages.
Partial European Search Report, European Patent Office, Sep. 28, 2005, Application No. 01204595.1-2203; 4 pages.
Stefan Lauxtermann et al., "A High Speed CMOS Imager Acquiring 5000 Frames/Sec," IEDM 99, 0/7803-5410-9/99, 1999 IEEE, pp. 875-878; 4 pages.
Aw et al., "A 128x128-Pixel Standard-CMOS Image Sensor with Electronic Shutter," ISSCC96/Session 11/Electronic Imaging Circuits/Paper FA 11.2, 1996 IEEE International Solid-State Circuits Conference, pp. 180-181 and 440; 3 pages.
Patent Abstracts of Japan Publication No. JP 59-67791, publication date Apr. 17, 1984; 1 page.
Aoki et al., "A Collinear 3-Chip Image Sensor," IEEE International Solid-State Circuits Conference, 1985, pp. 102-103; 3 pages.
Horii et al., "A 490 x 404 Element Imager for a Single-Chip Color Camera," IEEE International Solid-State Circuits Conference, 1985, pp. 96-97; 2 pages.
Nagakawa et al., "A 580 x 500-Element CCD Imager with a Shallow Flat P Well," IEEE International Solid-State Circuits Conference, 1985, pp. 98-99; 2 pages.
Mahowald, "Silicon Retina with Adaptive Photoreceptors," SPIE, vol. 1473, 1991, pp. 52-58; 7 pages.
Mann, "Implementing Early Visual Processing in Analog VLSI: Light Adaptation," SPIE, vol. 1473, 1991, pp. 128-136; 10 pages.
Ono et al., "Analysis of Smear Noise in Interine-CCD Image Sensor with Gate-Free Isolation Structure," Abstract of the 1991 International Conference on Solid State Devices and Materials, Yokohama, 1991, pp. 68-70; 6 pages.
Yadid-Pecht et al., "A Random Access Photodiode Array for Intelligent Image Capture," IEEE Transactions on Electron Devices, vol. 38, No. 8, Aug. 1991, pp. 1772-1780; 9 pages.
Ricquier et al., "Pixel Structure with Logarithmic Response for Intelligent and Flexible Imager Architectures," Microelectronic Engineering, 1992, pp. 631-634; 4 pages.
Sevenhans et al., "A 400mm Long Linear X-Ray Sensitive Image Sensor," IEEE International Solid-State Circuits Conference, 1987, pp. 108-109; 4 pages.
Anderson et al., "A Single Chip Sensor & Image Processor of Fingerprint Verification," IEEE 1991 Custom Integrated Circuits Conference, May 12-15, 1991; pp. 12.1.1-12.1.4; 4 pages.
Bart Dierickx, "XYW Detector: A Smart Two-Dimensional Particle Sensor," Nuclear Instruments and Methods in Physics Research A275, North-Holland Physics Publishing Division, 1989, pp. 542-544; 3 pages.
Klein, "Design and Performance of Semiconductor Detectors with Integrated Amplification and Charge Storage Capability," Nuclear Instruments and Methods in Physics Research A305, 1991, pp. 517-526; 11 pages.
Martin et al., "Dynamic Offset Null," IBM Technical Disclosure Bulletin, No. 23, No. 9, Feb. 1981, pp. 4195-4196; 2 pages.
Bogaerts et al., "High-End CMOS Active Pixel Sensor for Hyperspectral Imaging," 2005 IEEE Workshop on Charge-Coupled Devices and Advanced Image Sensors, R11, pp. 39-43, Jun. 9-11, 2005, Karuizawa Prince Hotel, Karuizawa, Nagano, Japan; 7 pages.
USPTO Notice of Allowance for U.S. Appl. No. 11/366,926 dated Jul. 15, 2009; 6 pages.
USPTO Non-Final Rejection for U.S. Appl. No. 11/366,926 dated Feb. 5, 2009; 15 pages.
USPTO Miscellaneous Action for U.S. Appl. No. 09/460,630 dated Aug. 16, 2004; 2 pages.
USPTO Notice of Allowance for U.S. Appl. No. 09/460,630 dated Feb. 27, 2004; 6 pages.
USPTO Non-Final Rejection for U.S. Appl. No. 09/460,630 dated Aug. 14, 2003; 6 pages.
USPTO Final Rejection for U.S. Appl. No. 09/460,630 dated Jan. 24, 2003; 9 pages.
USPTO Non-Final Rejection for U.S. Appl. No. 09/460,630 dated Jun. 10, 2002; 5 pages.
USPTO Final Rejection for U.S. Appl. No. 09/460,630 dated Dec. 6, 2001; 6 pages.
USPTO Non-Final Rejection for U.S. Appl. No. 09/460,630 dated May 23, 2001; 7 pages.
USPTO Requirement for Restriction/Election for U.S. Appl. No. 09/460,630 dated Mar. 21, 2001; 4 pages.
USPTO Miscellaneous Action for U.S. Appl. No. 09/460,630 dated Feb. 1, 2000; 1 page.
USPTO Notice of Allowance for U.S. Appl. No. 10/984,485 dated Apr. 9, 2007; 7 pages.
USPTO Non-Final Rejection for U.S. Appl. No. 10/984,485 dated Nov. 15, 2006; 8 pages.
USPTO Final Rejection for U.S. Appl. No. 11/707,723 dated Apr. 14, 2008; 9 pages.
USPTO Non-Final Rejection for U.S. Appl. No. 11/707,723 dated Oct. 15, 2007; 5 pages.
USPTO Requirement for Restriction/Election for U.S. Appl. No. 11/707,723 dated Aug. 28, 2007; 5 pages.
USPTO Notice of Allowance for U.S. Appl. No. 09/736,651 dated Nov. 29, 2006; 7 pages.
USPTO Non-Final Rejection for U.S. Appl. No. 09/736,651 dated Jul. 12, 2006; 6 pages.
USPTO Non-Final Rejection for U.S. Appl. No. 09/736,651 dated Mar. 9, 2006; 8 pages.
USPTO Advisory Action for U.S. Appl. No. 09/736,651 dated Dec. 12, 2005; 3 pages.
USPTO Final Rejection for U.S. Appl. No. 09/736,651 dated Sep. 19, 2005; 7 pages.
USPTO Non-Final Rejection for U.S. Appl. No. 09/736,651 dated Apr. 8, 2005; 7 pages.
USPTO Advisory Action for U.S. Appl. No. 09/736,651 dated Feb. 24, 2005; 3 pages.
USPTO Final Rejection for U.S. Appl. No. 09/736,651 dated Nov. 17, 2004; 6 pages.
USPTO Non-Final Rejection for U.S. Appl. No. 09/736,651 dated Jun. 2, 2004; 7 pages.
USPTO Advisory Action for U.S. Appl. No. 09/736,651 dated Apr. 19, 2004; 3 pages.
USPTO Final Rejection for U.S. Appl. No. 09/736,651 dated Feb. 4, 2004; 7 pages.
USPTO Non-Final Rejection for U.S. Appl. No. 09/736,651 dated Aug. 20, 2003; 6 pages.
USPTO Advisory Action for U.S. Appl. No. 09/736,651 dated Jun. 11, 2003; 3 pages.
USPTO Final Rejection for U.S. Appl. No. 09/736,651 dated Apr. 7, 2003; 6 pages.
USPTO Non-Final Rejection for U.S. Appl. No. 09/736,651 dated Sep. 11, 2002; 5 pages.
USPTO Requirement for Restriction/Election for U.S. Appl. No. 09/736,651 dated Jul. 15, 2002; 4 pages.
USPTO Miscellaneous Action for U.S. Appl. No. 09/906,418 dated Mar. 2, 2007; 3 pages.
USPTO Notice of Allowance for U.S. Appl. No. 09/906,418 dated Feb. 1, 2007; 6 pages.
USPTO Non-Final Rejection for U.S. Appl. No. 09/906,418 dated Oct. 6, 2005; 9 pages.
USPTO Final Rejection for U.S. Appl. No. 09/906,418 dated Jun. 15, 2005; 11 pages.
USPTO Non-Final Rejection for U.S. Appl. No. 09/906,418 dated Feb. 28, 2005; 12 pages.
USPTO Notice of Allowance for U.S. Appl. No. 08/635,035 dated Nov. 24, 1998; 2 pages.
USPTO Non-Final Rejection for U.S. Appl. No. 08/635,035 dated Jun. 1, 1998; 7 pages.
USPTO Requirement for Restriction for U.S. Appl. No. 08/635,035 dated Mar. 5, 1998; 5 pages.
USPTO Notice of Allowance for U.S. Appl. No. 09/021,010 dated Nov. 6, 2000; 2 pages.
USPTO Non-Final Rejection for U.S. Appl. No. 09/021,010 dated Apr. 25, 2000; 3 pages.
USPTO Non-Final Rejection for U.S. Appl. No. 09/021,010 dated Oct. 1, 1999; 1 pages.

USPTO Requirement for Restriction/Election for U.S. Appl. No. 09/021,010 dated Aug. 24, 1998; 3 pages.
USPTO Notice of Allowance for U.S. Appl. No. 11/366,926 dated Oct. 23, 2009; 7 pages.

USPTO Notice of Allowance for U.S. Appl. No. 09/164,158 dated Mar. 29, 1999; 7 pages.

* cited by examiner

CROSS TALK REDUCTION

REFERENCE TO RELATED APPLICATION

This application claims the benefit of U.S. Provisional Application No. 60/666,080, filed on Mar. 28, 2005, which is hereby incorporated by reference.

TECHNICAL FIELD

The present invention relates generally to a semiconductor based image sensor and, more particularly, to a semiconductor pixel structure for detecting electromagnetic radiation.

BACKGROUND

Semiconductor based sensors and devices for detecting electromagnetic radiation have been implemented in a semiconductor substrate in CMOS or MOS technology. In these sensors, the regions adapted for collecting charge carriers being generated by the radiation in the semiconductor substrate are formed of a p-n or a n-p junction photodiode with a substrate being of a n type conductivity or p type conductivity respectively. Such junctions are called collection junctions. Of the image sensors implemented in a complementary metal-oxide-semiconductor CMOS or MOS technology, image sensors with passive pixels and image sensors with active pixels are distinguished. The difference between these two types of pixel structures is that an active pixel amplifies the charge that is collect on its photosensitive element. A passive pixel does not perform signal amplification and requires a charge sensitive amplifier that is not integrated in the pixel.

One prior semiconductor based image sensor is illustrated in FIG. 1. In the semiconductor based image sensor of FIG. 1, the photodiode is formed by an n-p collection junction with the substrate being of p type conductivity. The photodiode that collects the charge carriers being generated by the radiation is shown on the right and the diode structure associated with the unrelated (to the detection) readout circuitry is shown on the left of the figure. If the diode structure for the non-related readout circuitry is placed in the neighborhood of the collection junction of the detector photodiode, part of the charges that otherwise would have reached the collection junction will be collected by junctions or components of the un-related readout circuitry. The charge carriers generated by light falling on the regions of the detector that are used for readout circuitry, therefore, are mainly collected by the junctions of this readout circuitry. The area taken by the readout circuitry in the pixels, therefore, is lost for collecting the radiation, which is essentially the reason for the low "fill factor" or low sensitivity of active pixel based sensors.

One semiconductor based image sensor, as described in U.S. Pat. No. 6,225,670 and illustrated in FIG. 2, provides a solution to the above describe problem with the image sensor illustrated in FIG. 1. The semiconductor based detector illustrated in FIG. 2 has a small, but effective, barrier well between the radiation sensitive volume in the semiconductor substrate and the regions and junctions with unrelated readout circuitry, and also has no or a lower barrier between the radiation sensitive volume in the semiconductor and the photodiode collection junction. The collection junction collects all photoelectrons that are generated in the epitaxial layer beneath the surface of the whole pixel. This is possible because the electrons will see a small but sufficient electrostatic barrier towards the active pixel circuitry and towards the substrate. The only direction in which no, or a low, barrier is present is the collection junction. Virtually all electrons will diffuse towards this junction. Such is pixel structure is also called "well-pixel" because in practice the collection junction in such pixel is implemented as a so-called n-well implantation.

However, the well pixel structure of FIG. 2 may have some cross-talk associated with it. For most applications, the ideal pixel can be considered as a square of Silicon, packed in array of nothing but such squares. The sensitive area is the complete square. The sensitivity is high and constant within the square and zero outside the square. That is, light impinging inside the pixel's boundary should contribute to the pixel's signal, and light impinging outside the boundary should not—it should contribute to another pixel's signal. Reality is less ideal. The optical information entering in a neighboring pixel's signal is called "optical cross-talk." Optical cross-talk is expressed in % signal lost to the neighbor. One makes sometimes distinction between left/right/up/down neighbors, and even $2^{nd}$, $3^{rd}$ neighbors. Optical cross-talk is typically also wavelength dependent. Short wavelengths typically suffer less from optical cross-talk than longer wavelengths. Optical cross-talk can be directly derived from the "effective pixel shape" (EPS). EPS can be understood as the pixel response as a function of an infinitesimal light spot that travels over the pixel (and beyond) in X and Y direction. The EPS for an ideal pixel is a square. The EPS for an ideal and for a real pixel and corresponding optical cross-talk are illustrated in FIG. 3.

FIG. 4 illustrates the optical cross-talk in a well pixel. Impinging light generates photo-electrons in the p-type epitaxial layer. These diffuse randomly until they reach the depletion layer of the photodiode's collection junction. When electrons are optically generated near the border between two pixels, the electrons can diffuse either way (i.e., to either one of the collection junctions of two neighboring pixels) as illustrated in FIG. 4. In such image sensors, the border of the pixels becomes "fuzzy." When translating this to image quality, the "fuzzyness" is the optical cross-talk between pixels. For the image created by an image sensor with such pixels the effect is a blurriness or lack of sharpness to the image.

BRIEF DESCRIPTION OF THE DRAWINGS

The present invention is illustrated by way of example and not limitation in the figures of the accompanying drawings, in which.

DETAILED DESCRIPTION

A pixel having a structure to reduce cross-talk is described. In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines, and each of the single signal lines may alternatively be buses.

Figure 5:
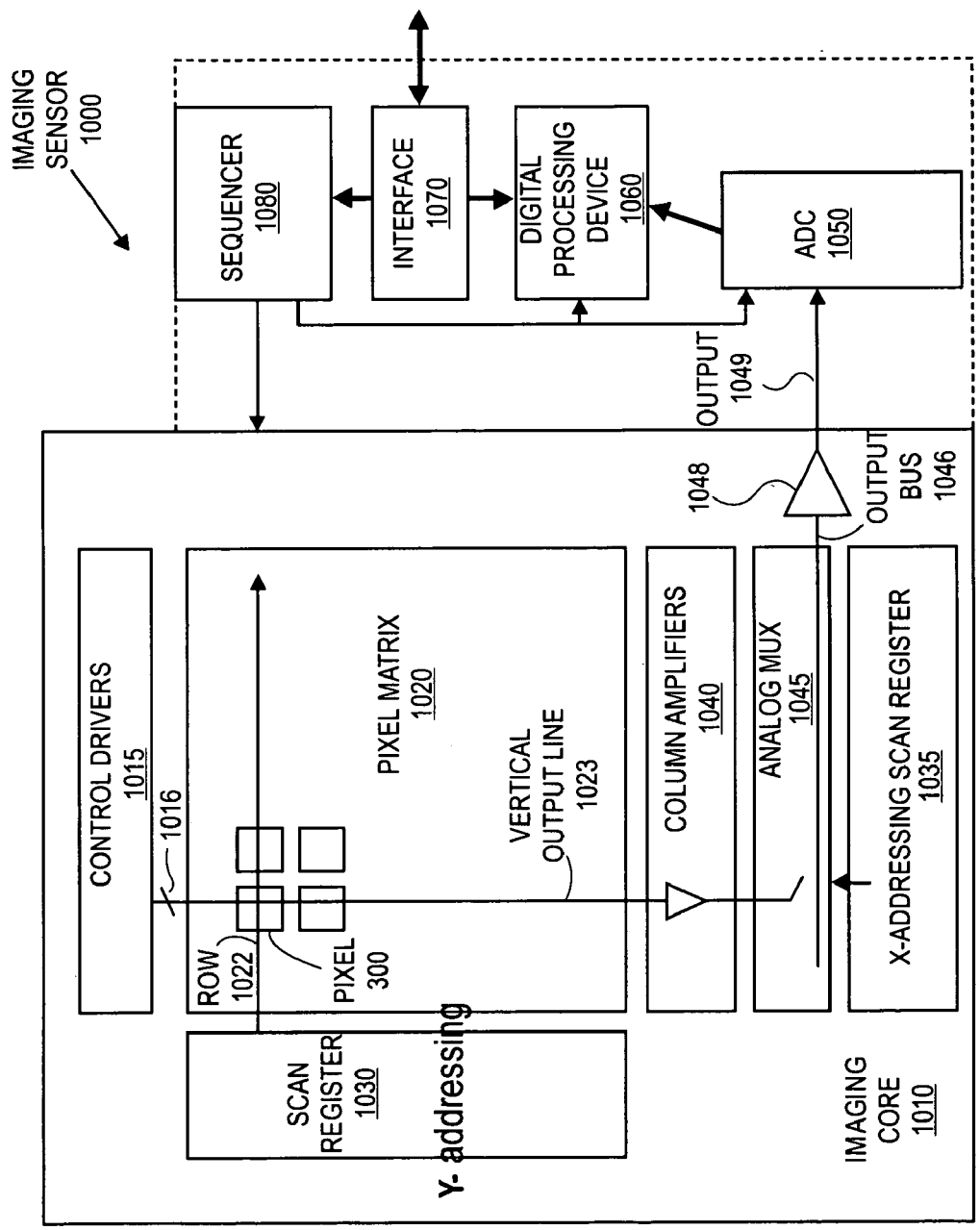
FIG. 5 illustrates one embodiment of an image sensor implementing the methods and apparatus described herein.

FIG. 5 illustrates one embodiment of an image sensor implementing the methods and apparatus described herein. Image sensor 1000 includes an imaging core 1010 and components associated with the operation of the imaging core. The imaging core 1010 includes a pixel matrix 1020 having an array of pixels (e.g., pixel 300) and the corresponding driving and sensing circuitry for the pixel matrix 1020. The driving and sensing circuitry may include: one or more scanning registers 1035, 1030 in the X- and Y-direction in the form of shift registers or addressing registers; buffers/line drivers for the long reset and select lines; column amplifiers 1040 that may also contain fixed pattern noise (FPN) cancellation and double sampling circuitry; and analog multiplexer (mux) 1045 coupled to an output bus 1046. FPN has the effect that there is non-uniformity in the response of the pixels in the array. Correction of this non-uniformity needs some type of calibration, for example, by multiplying or adding/subtracting the pixel's signals with a correction amount that is pixel dependent. Circuits and methods to cancel FPN may be referred to as correlated double sampling or offset compensation and are known in the art; accordingly, a detailed description is not provided.

The pixel matrix 1020 may be arranged in N rows of pixels by N columns of pixels (with N≧1), with each pixel (e.g., pixel 300) is composed of at least a photosensitive element and a readout switch (not shown). A pixel matrix is known in the art; accordingly, a more detailed description is not provided.

The Y-addressing scan register(s) 1030 addresses all pixels of a row (e.g., row 1022) of the pixel matrix 1020 to be read out, whereby all selected switching elements of pixels of the selected row are closed at the same time. Therefore, each of the selected pixels places a signal on a vertical output line (e.g., line 1023), where it is amplified in the column amplifiers 1040. An X-addressing scan register(s) 1035 provides control signals to the analog multiplexer 1045 to place an output signal (amplified charges) of the column amplifiers 1045 onto output bus 1046. The output bus 1046 may be coupled to a buffer 1048 that provides a buffered, analog output 1049 from the imaging core 1010.

The output 1049 from the imaging core 1010 is coupled to an analog-to-digital converter (ADC) 1050 to convert the analog imaging core output 1049 into the digital domain. The ADC 1050 is coupled to a digital processing device 1060 to process the digital data received from the ADC 1050 (such processing may be referred to as imaging processing or post-processing). The digital processing device 1060 may include one or more general-purpose processing devices such as a microprocessor or central processing unit, a controller, or the like. Alternatively, digital processing device 1060 may include one or more special-purpose processing devices such as a digital signal processor (DSP), an application specific integrated circuit (ASIC), a field programmable gate array (FPGA), or the like. Digital processing device 1060 may also include any combination of a general-purpose processing device and a special-purpose processing device.

The digital processing device 1060 is coupled to an interface module 1070 that handles the information input/output (I/O) exchange with components external to the image sensor 1000 and takes care of other tasks such as protocols, handshaking, voltage conversions, etc. The interface module 1070 may be coupled to a sequencer 1080. The sequencer 1080 may be coupled to one or more components in the image sensor 1000 such as the imaging core 1010, digital processing device 1060, and ADC 1050. The sequencer 1080 may be a digital circuit that receives externally generated clock and control signals from the interface module 1070 and generates internal signals to drive circuitry in the imaging core 1010, ADC 1050, etc. In one embodiment, the voltage supplies that generate the control signals used to control the various components in the pixel structure of FIG. 5 discussed below may be generated by drivers illustrated by control drivers block 1015.

It should be noted that the image sensor illustrated in FIG. 5 is only an exemplary embodiment and an image sensor may have other configurations than that depicted in FIG. 5. For example, alternative embodiments of the image sensor 1000 may include one ADC 1050 for every pixel 300, for every column (i.e., vertical output line 1023), or for a subset block of columns. Similarly, one or more other components within the image sensor 1000 may be duplicated and/or reconfigured for parallel or serial performance. For example, a fewer number of column amplifiers 1040 than pixel matrix columns may be used, with column outputs of the pixel matrix multiplexed into the column amplifiers. Similarly, the layout of the individual components within the image sensor 1000 may be modified to adapt to the number and type of components. In another embodiment, some of the operations performed by the image sensor 1000 may be performed in the digital domain instead of the analog domain, and vice versa.

Figure 6A:
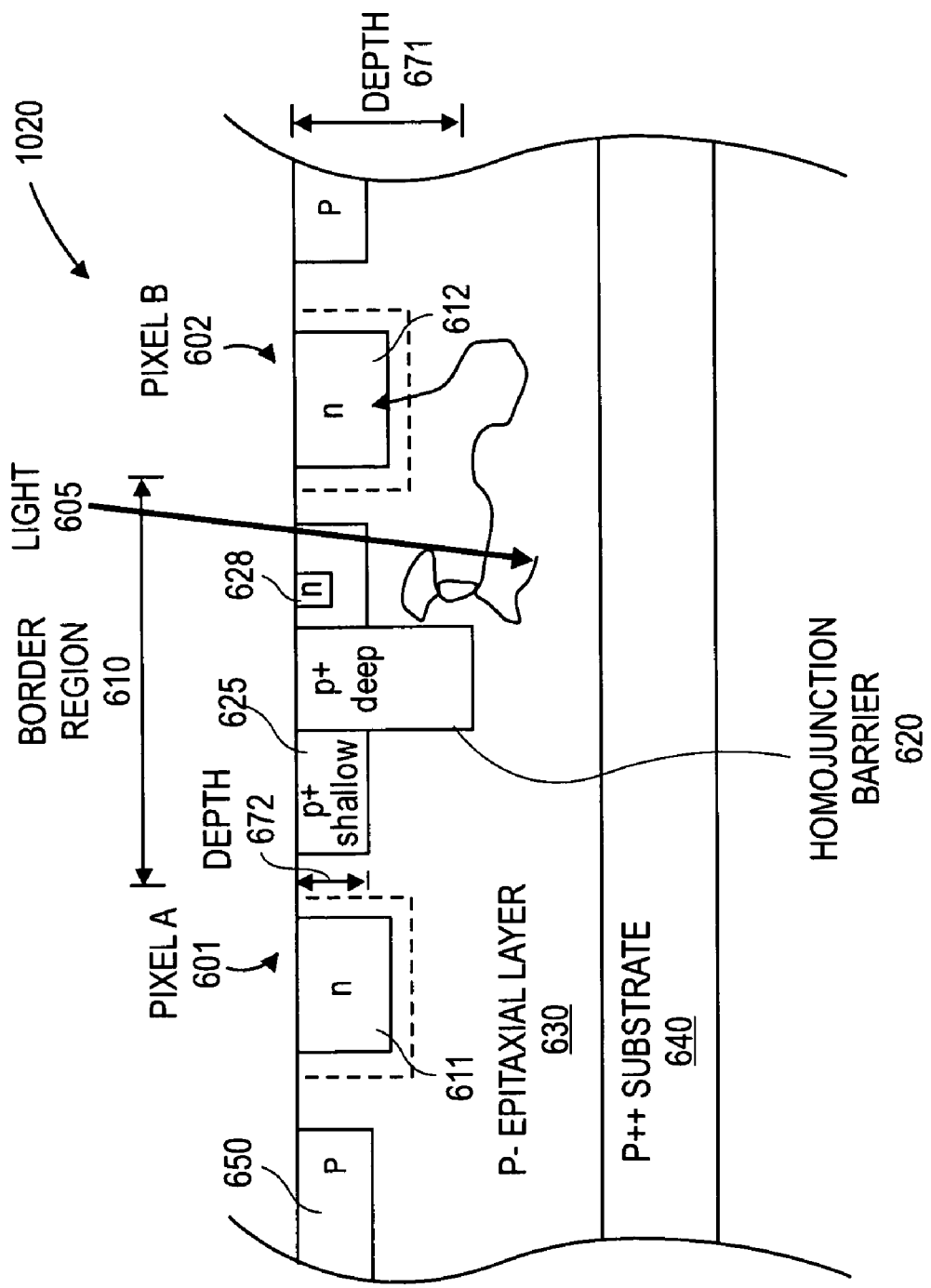
FIG. 6A is a cross sectional view illustrating one embodiment of pixels having a homojunction barrier to reduce optical cross talk.

FIG. 6A is a cross sectional view illustrating one embodiment of pixels having a homojunction barrier to reduce optical cross talk. Two neighboring pixels of the pixel matrix 1020 are illustrated in FIG. 6A: pixel A 601 and pixel B 602. Pixel A and Pixel B in the embodiment illustrated in FIG. 6A are formed using an n-p junction photodiode with a substrate that is of a p type conductivity substrate 640. The n regions 611 and 612 are collection junctions for pixels A and B, respectively, for collecting charge carriers being generated by radiation in epitaxial layer 630 and/or substrate 640. The radiation may be of any type of radiation, for example, all forms of light including infra-red and ultraviolet as well as the optical spectrum, high energy electromagnetic rays such as x-rays and nuclear particles. The n regions 611 and 612 form photodiodes with epitaxial layer 630 in pixels A and B, respectively. The n region 628 is a junction that may be part of readout circuitry for operating on signals being generated by the charge carriers collected by the collection region 611. The fabrication and configuration of a pixel is known in the art; accordingly, a more detailed discussion is not provided. It should be noted that the pixels may include other regions and structures that are not illustrated so as not to obscure an understanding of embodiments of the present invention.

In this embodiment, the border region 610 between the photodiodes of pixel A 601 and pixel B 602, respectively, in pixel matrix includes a homojunction barrier 620 that inhibits electrons that are optically generated (by light 605) in one pixel (e.g., pixel B 602) from diffusing to a neighbor pixel (e.g., pixel A 601). The homojunction barrier 620 may be composed of a deep, heavily doped (denoted by "+") p+ region. In one embodiment, the homojunction barrier 620 may be approximately 2 times or more as heavily doped (denoted by "++") with respect to a region (e.g., epitaxial layer 630) designated as "p–". "Deep" as used herein means protruding deeper in the epitaxial layer 630 than other p regions (e.g., p region 650) in the pixel 1020. In one particular embodiment, the homojunction barrier 620 may be at least approximately 2 times deeper (depth 671) than the depth 672 of the shallower p region 625.

Figure 1:
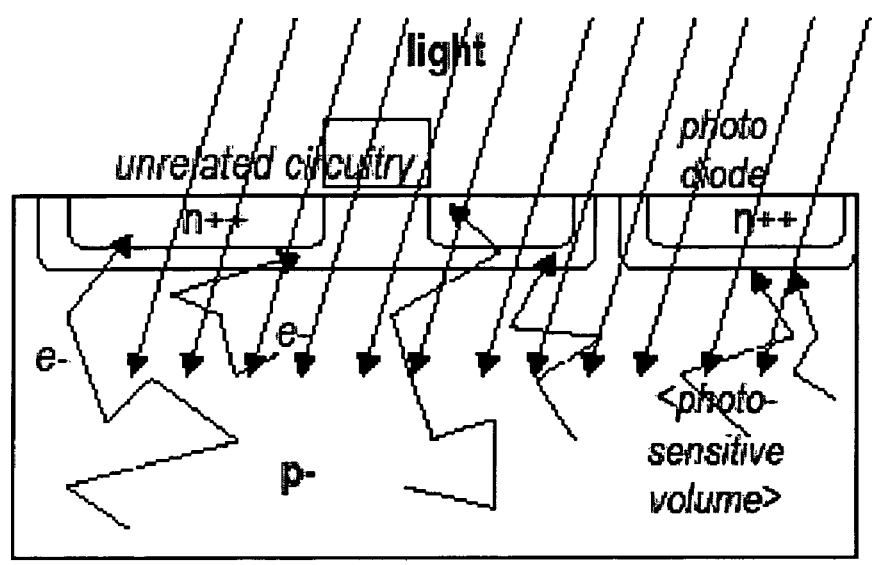
FIG. 1 illustrates one prior semiconductor based image sensor.
Figure 2:
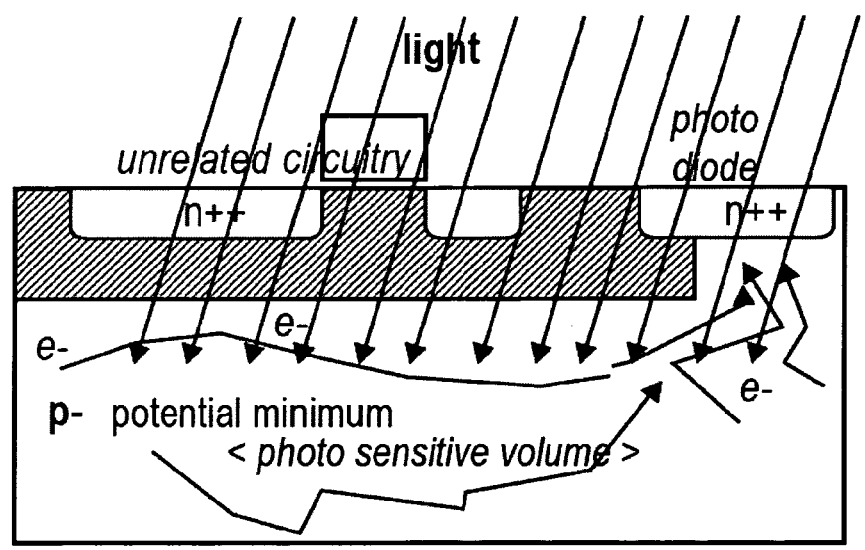
FIG. 2 illustrates another, conventional semiconductor based image sensor.
Figure 3:
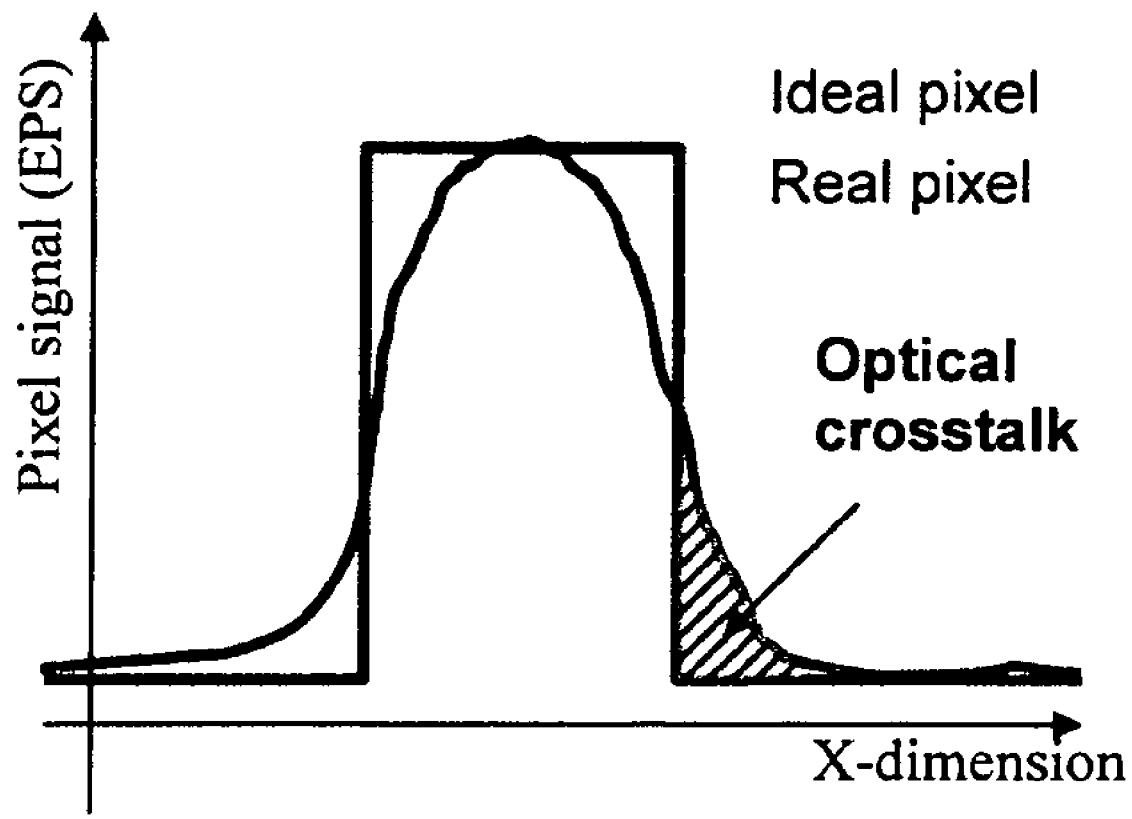
FIG. 3 illustrates the derivation of optical cross-talk from an effective pixel shape.
Figure 4:
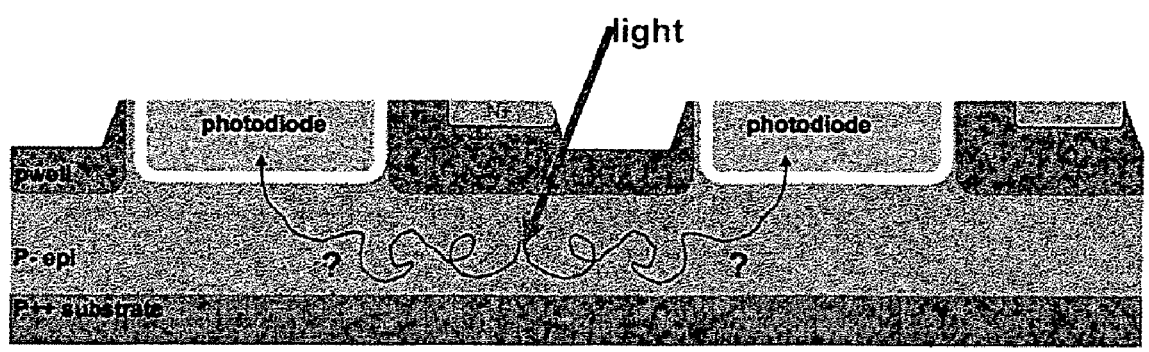
FIG. 4 conceptually illustrates optical cross-talk in a well pixel.

In one embodiment, the homojunction barrier 620 may be disposed in a shallow p region 625. "Shallow" as used herein means protruding less into the epitaxial layer 630 less than the n regions (e.g., region 612) in a pixel (e.g., pixel B 602). In one embodiment, the shallow p region 625 may be a "p-well" implant (for example similar to that described in regards to FIG. 4 at the border between two pixels). Such a p-well may contain an n-region 628 that is used in the fabrication of nMOSFETS. Alternatively, the shallow p region 625 may be a p+ implant used, for example, as an nMOSFET source-drain, with the deeper p region being formed as a p-well. It should be noted that in an embodiment where the p+ region of the homojunction barrier 620 is has depth 671 of approximately 2 to 4 times deeper than the depth 672 shallow p region 625, the formation of the homojunction region may be referred to as a tub. In yet another embodiment illustrated in FIG. 6C, the homojunction barrier 620 may not be formed in a shallow p-region but, rather, directly formed in the p– epitaxial layer 630.

The difference in doping concentrations between the p– epitaxial layer 630 and the p+ homojunction barrier 620 represents a weak electrostatic barrier and electric field that counteracts the diffusion of electrons from p– towards p+, hence it will inhibit electrons from passing from one pixel (e.g., pixel B 602) to another neighboring pixel (e.g., pixel A 601). The diffusion of electrons from the area of one pixel to the neighbor pixel is impeded by a p+ region of the homojunction barrier 620 in the p– epitaxial layer 630 disposed between the collection regions 611 and 612. In an alternative embodiment, an epitaxial layer may not be used and the regions may be disposed directly in another type of charge generation layer, for example, tub regions or substrate. In either configuration, the homojunction barrier 620 may protrude into the substrate. The homojunction barrier 620 may result in a crisper separation of the optical volumes of neighboring pixels by reducing the mixing of signals of neighboring pixels.

Figure 6B:
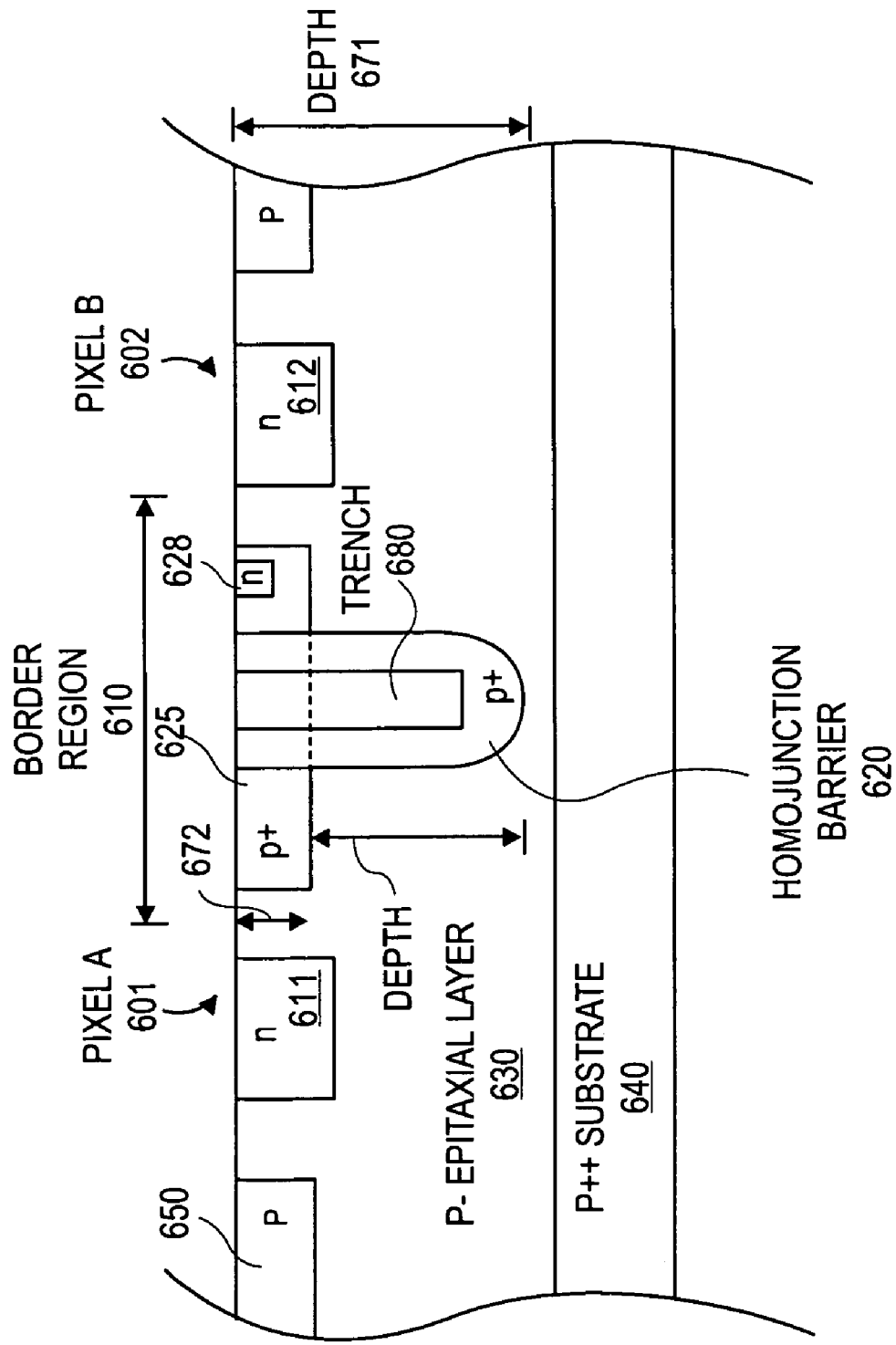
FIG. 6B is a cross sectional view illustrating another embodiment of pixels having a homojunction barrier formed around a trench.
Figure 6C:
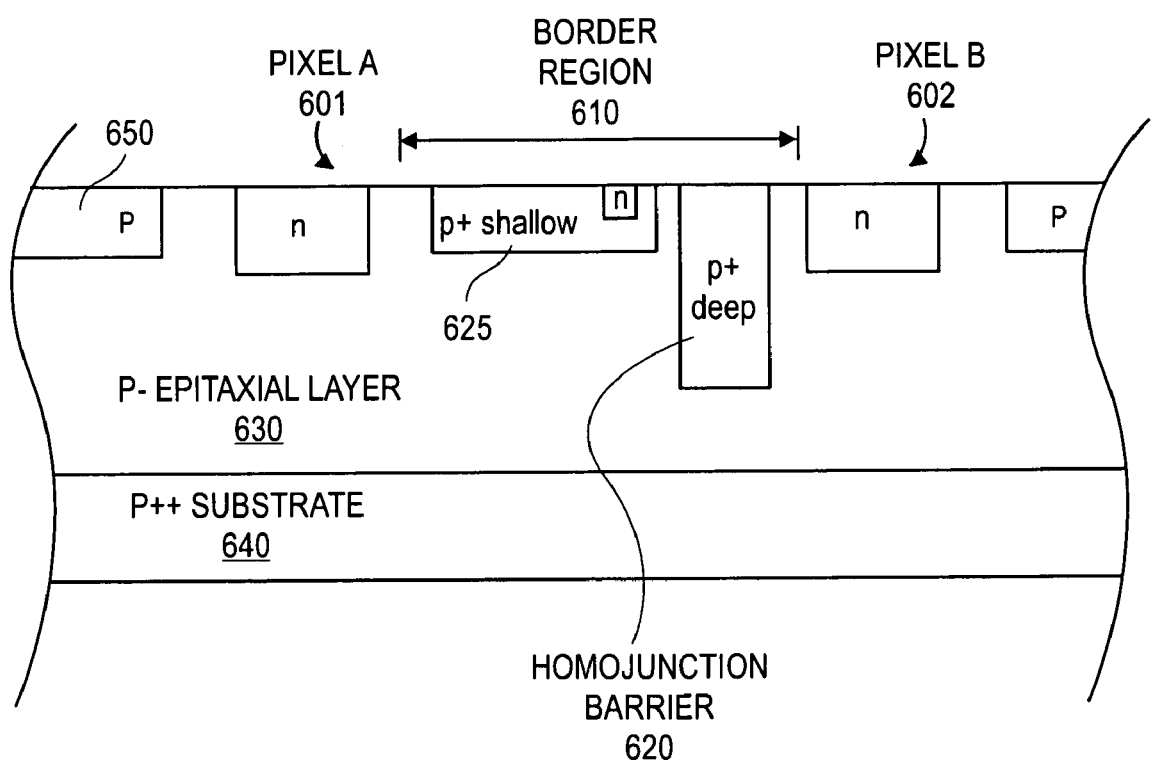
FIG. 6C is a cross sectional view illustrating yet another embodiment of pixels having a homojunction barrier to reduce optical cross talk.

FIG. 6B is a cross sectional view illustrating an alternative embodiment of pixels having a homojunction barrier to reduce optical cross talk. In this embodiment, the homojunction barrier 620 is formed around a trench 680. The formation of a trench is known in the art; accordingly, a detailed description is not provided.

Although formation of the homojunction barrier 620 is discussed at times in relation to an implantation operation for ease of explanation, it should be noted that other fabrication techniques may be used to generate the doped region, for example, diffusion and epitaxial growth. Such fabrication techniques are known in the art; accordingly, a detailed discussion is not provided. In addition, the pixels structures have been illustrated and discussed in regards to a using an n-p junction photodiode with a substrate that is of a p type conductivity substrate only for ease of explanation purposes. In an alternative embodiment, the pixels may be formed using a p-n junction photodiode with a substrate that is of a n type conductivity substrate and, correspondingly, an n type homojunction barrier 620.

In alternative embodiments, other structures may be utilized to reduce cross-talk between neighboring pixels, for example, as described below.

Figure 7:
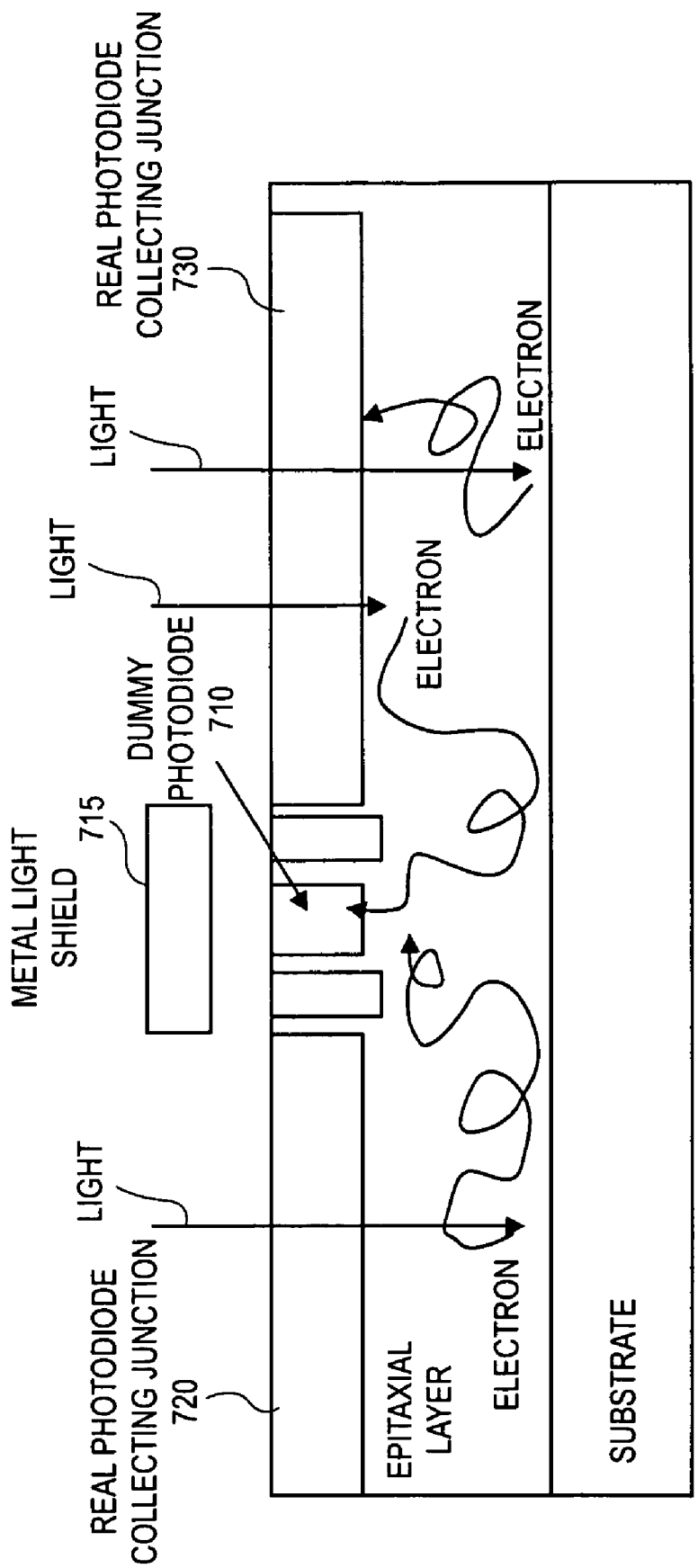
FIG. 7 illustrates an alternative embodiment of a pixel matrix structure to reduce optical cross-talk.

FIG. 7 illustrates an alternative embodiment of a pixel structure to reduce cross-talk. In this embodiment, reduction of cross-talk may be achieved by a dummy photodiode collection region 710 (e.g., n-implant {that is typically but not necessarily of the same nature as the real photodiode}) between the real photodiode collection regions 720 and 730. This dummy photodiode may also be additionally covered by a metal light shield 715. Alternatively, the metal light shield 715 need not be used. Although the structure illustrated in FIG. 7 may require additional room for the dummy diode plus buffer space, it may provide an effective countermeasure for cross-talk. The photo-charge that attempts to cross the border between tow pixels is collected by the dummy photodiode.

Figure 8:
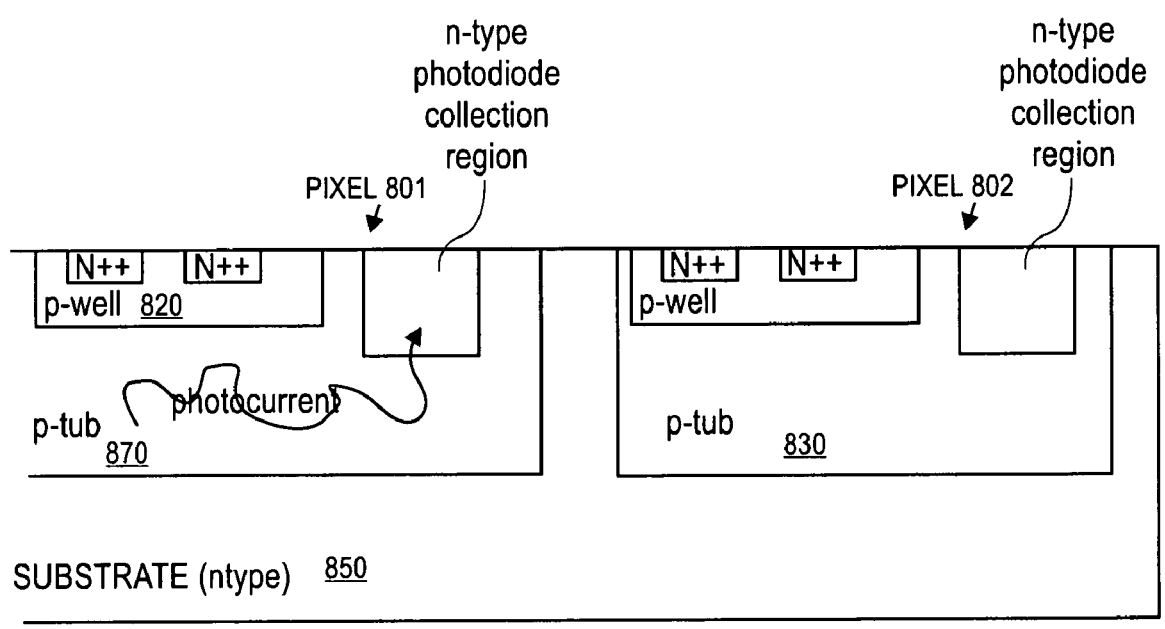
FIG. 8 illustrates another embodiment of pixel structures to reduce optical cross-talk.

FIG. 8 illustrates another embodiment of a pixel structure to reduce cross-talk. In this embodiment, cross-talk may be reduced by embedding a pixel 801 in a deeper tub region 810 than the p-well region 820. The photosensitive volume is now confined to the p-tub 810. Each pixel is contained in a separate p-tub. For example, pixel 801 is contained in p-tub 810 and pixel 802 is contained in p-tub 830. Since electrons cannot diffuse between p-tubs, in the n-type substrate 850, there may be no resulting cross-talk at all.

It should be noted that the semiconductor manufacturing processes of fabricating the various regions and layers described above are known in the art; accordingly, more detailed descriptions are not provided.

Embodiments of the present have been illustrated with a photodiode device type and CMOS technology for ease of discussion. In alternative embodiments, other device types (e.g., photogate and phototransistor), device technologies (e.g., charge coupled device (CCD) and buried channel CMOS), and process technologies (e.g., nMOS, buried channel CMOS and BiCMOS) may be used. Furthermore, the image sensors discussed herein may be applicable for use with all types of electromagnetic (EM) radiation (i.e., wavelength ranges) such as, for example, visible, infrared, ultraviolet, gamma, x-ray, microwave, etc. In one particular embodiment, the image sensors and pixel structures discussed herein are used with EM radiation in approximately the 300-1100 nanometer (nm) wavelength range (i.e., visible light to near infrared spectrum). Alternatively, other the image sensors and pixel structures discussed herein may be used with EM radiation in other wavelength ranges.

The image sensor and pixel structures discussed herein may be used in various applications including, but not limited to, a digital camera system, for example, for general-purpose photography (e.g., camera phone, still camera, video camera) or special-purpose photography (e.g., in automotive systems, hyperspectral imaging in space borne systems, etc). Alternatively, the image sensor and pixel structures discussed herein may be used in other types of applications, for example, machine and robotic vision, document scanning, microscopy, security, biometry, etc.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A semiconductor based image sensor having pixels, comprising:
   in each of the pixels, a first region having dopants of a first conductivity type disposed in a charge generation layer having dopants of a second conductivity type;
   in a border region between pixels, a second region having dopants of the second conductivity type disposed in the charge generation layer, wherein the second region is deeper in the charge generation layer than the first region; and
   a third region of the second conductivity type disposed in the charge generation layer, wherein the second region is at least twice as deep in the charge generation layer as the third region, wherein the first region and third region are laterally disposed in relation to one another, and wherein the first region is deeper in the charge generation layer than the third region.

2. The semiconductor based image sensor of claim 1, wherein the first conductivity type is n-type and wherein the second conductivity type is p-type.

3. The semiconductor based image sensor of claim 1, wherein the charge generation layer and the first region in each of the pixels form photodiodes.

4. The semiconductor based image sensor of claim 1, wherein the border region comprises a homojunction barrier comprising the second region having dopants of the second conductivity type.

5. The semiconductor based image sensor of claim 1, wherein the third region is part of readout circuitry for operating on signals being generated by charge carriers collected by the first region.

6. The semiconductor based image sensor of claim 1, wherein the second region is disposed in the third region.

7. The semiconductor based image sensor of claim 6, wherein the charge generation layer is an epitaxial layer, wherein the third region is a p-well and the second region is a p-implant.

8. The semiconductor based image sensor of claim 1, wherein the second region is disposed in the charge generation layer outside of the third region.

9. The semiconductor based image sensor of claim 1, further comprising a trench in the border region, wherein the second region is disposed around the trench.

10. The semiconductor based image sensor of claim 9, wherein the charge generation layer is an epitaxial layer and wherein the third region is a p-well and the second region is a p-implant.

11. The semiconductor based image sensor of claim 1, wherein the charge generation layer is an epitaxial layer and wherein the third region is a p-well and the second region is a p-implant.

12. The semiconductor based image sensor of claim 1, further comprising a fourth region having dopants of the first conductivity type disposed in the third region.

13. A method, comprising:
    providing a semiconductor based image sensor having neighboring pixels, wherein said pixels comprise photodiodes, each having a first region of dopants of a first conductivity type;
    receiving radiation in a charge collection layer of the semiconductor based image sensor to generate electrons, wherein said charge collection layer is comprised of dopants of a second conductivity type, wherein the first region is disposed in said charge collection layer at a first depth; and
    inhibiting the diffusion of electrons that are generated closer to one of the neighboring pixels than to the other of the neighboring pixels using a second region, wherein said second region is comprised of the second conductivity type different from the first conductivity type, wherein said second region has a greater depth in said charge collection layer than the first region, and a third region of the second conductivity type disposed in the charge generation layer, wherein said second region is at least twice as deep in the charge generation layer as the third region, wherein the first region and third region are laterally disposed in relation to one another, and wherein the first region has a greater depth in said charge collection layer than the third region.

14. The method of claim 13, wherein the first conductivity type is n-type and wherein the second conductivity type is p-type.

15. The method of claim 13, wherein the charge collection layer is an epitaxial layer and wherein the second region is a p-implant and the third region is a p-well.

* * * * *